United States Patent [19]

Kita et al.

[11] Patent Number: 5,421,890
[45] Date of Patent: Jun. 6, 1995

[54] APPARATUS FOR PRODUCING OXIDE THIN FILM

[75] Inventors: Ryusuke Kita, Urayasu; Takashi Hase, Ichikawa; Masato Sasaki, Mitaka; Tadataka Morishita, Kanagawa, all of Japan

[73] Assignees: International Superconductivity Technology Center, Tokyo; Sharp Kabushiki Kaisha, Osaka; Kabushiki Kaisha Kobe Seiko Sho, Hyogo, all of Japan

[21] Appl. No.: 98,903

[22] Filed: Jul. 29, 1993

Related U.S. Application Data

[62] Division of Ser. No. 911,492, Jul. 10, 1992, Pat. No. 5,254,363.

[30] Foreign Application Priority Data

Jul. 10, 1991 [JP] Japan ................... 3-169734

[51] Int. Cl.$^6$ ................... C23C 14/24; C23C 16/40
[52] U.S. Cl. ................... 118/719; 118/715; 118/725; 118/726
[58] Field of Search ................ 118/719, 726, 725, 715

[56] References Cited

U.S. PATENT DOCUMENTS

| | | | |
|---|---|---|---|
| 4,655,167 | 4/1987 | Nakamura et al. | 118/718 |
| 4,763,602 | 8/1988 | Madan et al. | 118/719 |
| 5,316,585 | 5/1994 | Okamoto | 118/719 |

FOREIGN PATENT DOCUMENTS

| | | |
|---|---|---|
| 2129643 | 3/1972 | Germany . |
| 63-259070 | 10/1988 | Japan . |
| 64-72418 | 3/1989 | Japan ................... 505/732 |
| 01-72418 | 3/1989 | Japan . |
| 3-218906 | 9/1991 | Japan ................... 505/732 |

OTHER PUBLICATIONS

Aida, Japanese Journal of Applied Physics, vol. 28, No. 4, Apr., 1989, pp. L635–L638.
"Properties of Reactively-Sputtered Copper Oxide Thin Films" by V. F. Drobny & D. L. Pulfrey, Thin Solid Films, 61(1979) pp. 89–98.

*Primary Examiner*—Richard Bueker
*Attorney, Agent, or Firm*—Birch, Stewart, Kolasch & Birch

[57] ABSTRACT

Disclosed is an oxide thin film producing method and apparatus for producing an oxide thin film having excellent crystallinity and purity with high productivity while correctly controlling the composition of the oxide thin film. After reducing the pressure inside a vacuum chamber to $1 \times 10^{-9}$ Torr or less, a metal thin film is formed by evaporating a specified metal element and depositing vapor of the metal element on a substrate in the vacuum chamber. Then a cover member is moved upward to closely abut to a cover receiving member to thereby form an airtight chamber for enclosing the substrate airtightly in the vacuum chamber. With the degree of vacuum around the airtight chamber maintained, $O_2$ gas is directly introduced into the airtight chamber through a gas piping to oxidize the metal thin film and thereby form an oxide thin film. At the same time, the gas inside the airtight chamber is discharged directly out of the vacuum chamber through a gas piping.

5 Claims, 4 Drawing Sheets

APPARATUS FOR PRODUCING OXIDE THIN FILM

This application is a divisional of copending application Ser. No. 07/911,492, filed on Jul. 10, 1992, now U.S. Pat. No. 5,254,363 the entire contents of which are hereby incorporated by reference.

BACKGROUND OF THE INVENTION

1. Field of the Invention

The present invention relates to a method and apparatus for producing an oxide thin film, and more particularly to a method and apparatus for producing an oxide thin film having a metal element in its composition.

2. Description of the Prior Art

Conventionally, as a method of producing oxide thin films containing a metal element (grouped into oxide semiconductors, insulating materials, oxide superconductors, oxide magnetic substances, and others by the properties of the films), there have been widely put in practice a reactive vapor deposition method, a sputtering method, a chemical vapor deposition method, and the like. For example, according to the reactive vapor deposition method, a specified metal element is evaporated from a vapor source in an oxygen gas environment at a pressure in the range of about $10^{-5}$ to $10^{-3}$ Torr in a vacuum chamber so that an oxide of the evaporated metal element is deposited directly onto a substrate.

According to another known production method, after depositing a metal thin film onto a substrate in a vacuum chamber, an oxide thin film is obtained by taking out the substrate out of the vacuum chamber and oxidizing the metal thin film, or by introducing oxidization gas into the vacuum chamber and oxidizing the metal thin film.

In either of the above-mentioned methods, the vapor depositing or growing process starts inside the vacuum chamber at a pressure of not smaller than $10^{-8}$ Torr.

However, since the vapor depositing or growing process starts at a pressure of $10^{-8}$ Torr or above in either of the above-mentioned conventional methods, residual gases such as $H_2O$, $N_2$, $H_2$, $CO_2$, or the like are taken in as impurities, which results in reducing the purity of the oxide thin film produced.

According to the above-mentioned reactive vapor deposition method, the vapor deposition process is carried out in an approximately $10^{-5}$ to $10^{-3}$ Torr oxygen gas environment, and disadvantageously the vapor source is oxidized in the oxygen gas environment. Therefore, it is very difficult to obtain a stable or constant vapor rate and accurately control the composition of the resulting oxide thin film. Furthermore, since the degree of vacuum is not so good, i.e., the pressure inside the vacuum chamber is high, the vapor source must be heated to a high temperature to increase the vapor pressure. For example, when using yttrium (Y), a metal element known as having a high melting point, a temperature of approximately 1,100° C. is necessary to evaporate the metal element at a pressure of $10^{-6}$ Torr. Therefore, in order to vaporize metal having a high melting point, there is a limitation in sort of the vapor source to be adopted, and an evaporation cell such as a Knudsen cell or the like having an excellent controllability of vapor rate cannot be used.

On the other hand, according to the thin film producing method of firstly depositing a metal thin film and thereafter oxidizing the same, a residual gas covers the film surface in a short time (approximately 100 seconds) in a vacuum condition of approx. $10^{-8}$ Torr to reduce the crystallinity and surface activity of the metal thin film. The above results in the problem that no oxide thin film having an excellent crystallinity and purity can be obtained after the oxidization process. Furthermore, once the substrate with a metal thin film is taken out of the vacuum chamber, the film surface will be contaminated, resulting in further reduction of the crystallinity and purity. When an oxidizing gas is introduced into the vacuum chamber to oxidize the metal thin film, the oxidizing gas is adsorbed into the internal walls of the vacuum chamber. Therefore, when producing oxide thin films repeatedly, it is difficult to evacuate the vacuum chamber to a high vacuum, which fatally results in reducing the productivity.

SUMMARY OF THE INVENTION

The present invention has been developed with a view to substantially solving the above described disadvantages and has for its essential object to provide an oxide thin film producing method and apparatus capable of producing an oxide thin film having excellent crystallinity and purity with high productivity while accurately controlling the composition of the thin film.

In order to accomplish the above object, the present invention provides a method of producing an oxide thin film comprising the steps of:

reducing a pressure inside a vacuum chamber till vacuum of $1 \times 10^{-9}$ Torr or less is obtained;

evaporating a specified metal element and depositing vapor of the metal element onto a substrate in the vacuum chamber to form a metal thin film;

forming an airtight chamber enclosing the substrate airtightly in the vacuum chamber;

oxidizing the metal thin film to form an oxide thin film by introducing an oxidizing gas directly into the airtight chamber while the vacuum is maintained around the airtight chamber; and discharging the gas inside the airtight chamber directly out of the vacuum chamber.

According to the production method of the present invention, a metal thin film is formed after a pressure inside the vacuum chamber is reduced to $1 \times 10^{-9}$ Torr or less. Therefore, there is left little residual gas in the vacuum chamber and an extremely decreased amount of impurities is adsorbed in the resulting metal thin film. Accordingly, a high-purity metal thin film is formed on the substrate. Since the thus formed metal thin film is kept in the extremely high vacuum, the surface of the metal thin film is not covered by the residual gas in a short time, so that a good surface activity is obtained. Therefore, when an airtight chamber is then formed in a manner enclosing the substrate airtightly in the vacuum chamber and the oxidizing gas is introduced into the airtight chamber, the metal element forming the metal thin film is readily oxidized. This provides an oxide thin film which contains the metal element in its composition and has a good crystallinity and high purity. It is to be noted that the criterion of $1 \times 10^{-9}$ Torr for the pressure inside of the vacuum chamber has been confirmed through experiments carried out by the inventors.

Furthermore, according to the method of the present invention, since the vapor deposition process is started after the pressure of $1 \times 10^{-9}$ Torr or less is obtained, the pressure inside the vacuum chamber during the vapor deposition process is sufficiently low, when compared with conventional methods, to cause metals having a high melting point to be easily evaporated. In the case of yttrium, for example, a required heating temperature for this metal element is only about 890° C. in the environment of $10^{-10}$ Torr. Therefore, even when such a metal having a high melting point is used, it is possible to use as the vapor source an evaporation cell having a good vapor-rate controllability.

In addition, since the oxidizing gas is introduced directly into the airtight chamber with the degree of vacuum around the airtight chamber being maintained and the gas inside the airtight chamber is discharged directly out of the vacuum chamber, the vapor source is prevented from being brought into contact with the oxidizing gas and thereby oxidized. Therefore, the vapor rate of the metal element is constant and the composition of the resulting oxide thin film is accurately controlled. In addition, for the same reason, adsorption of the oxidizing gas into inner walls of the vacuum chamber is avoided. Accordingly, even when producing oxide thin films repeatedly, the inside of the vacuum chamber can be easily put into an extremely high vacuum condition, so that productivity of the films is improved.

The present invention also provides an apparatus for producing an oxide thin film comprising:

a vacuum chamber for receiving therein a substrate;

means for heating the substrate;

a first exhaust system for reducing a pressure inside the vacuum chamber till vacuum of $1 \times 10^{-9}$ Torr or less is obtained;

a vapor source provided in the vacuum chamber for evaporating a specified metal element toward the substrate;

a cover member provided movably in the vacuum chamber, the cover member serving to form an airtight chamber for enclosing the substrate airtightly in the vacuum chamber when the cover member has been moved to be positioned in the vicinity of the substrate;

a gas intake system for introducing an oxidizing gas into the airtight chamber while the vacuum is maintained around the airtight chamber; and a second exhaust system for discharging the gas inside the airtight chamber directly out of the vacuum chamber.

According to the apparatus of the present invention, the vacuum chamber is evacuated by the first exhaust system till the pressure of $1 \times 10^{-9}$ Torr or less is achieved. While a metal thin film is formed on the substrate by vapor-deposition, the cover member is spaced from the substrate. Therefore, vapor of a metal element coming from the vapor source is deposited onto the substrate without being stopped by the cover member. The cover member can form or define the airtight chamber in the vacuum chamber if the cover member is moved toward the substrate. Into this airtight chamber is introduced the oxidizing gas by means of the gas intake system while the degree of vacuum of the vacuum chamber is maintained. This oxidizing gas oxidizes the metal thin film on the substrate to form an oxide thin film. Therefore, with this apparatus, the method of producing oxide thin films of the present invention can be implemented. The gas present inside the airtight chamber is discharged directly out of the vacuum chamber by means of the second exhaust system. Accordingly, the inside of the vacuum chamber is maintained under a very high vacuum condition, so that the oxidizing gas is prevented from being adsorbed in walls of the vacuum chamber.

When the gas intake system has a gas piping penetrating both a wall of the vacuum chamber and the cover member, it is possible to introduce the oxidizing gas directly into the airtight chamber via the gas piping from outside of the vacuum chamber. Therefore the high vacuum condition of the vacuum chamber is easily maintained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following describes in detail a method and apparatus for producing an oxide thin film according to an embodiment of the present invention.

Figure 1:
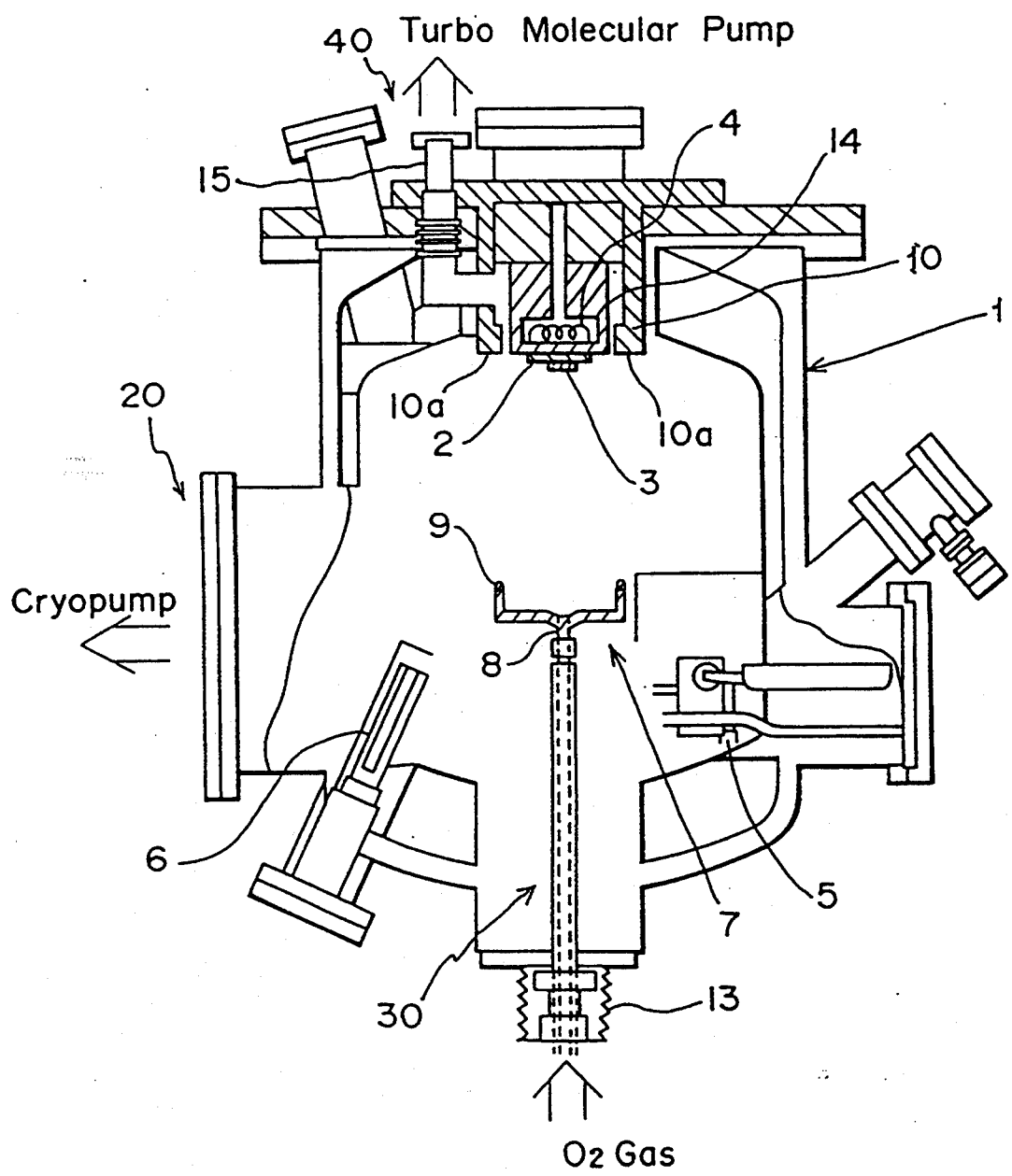
FIG. 1 is a partially sectional view of an apparatus for producing an oxide thin film in accordance with the present invention.
Figure 2:
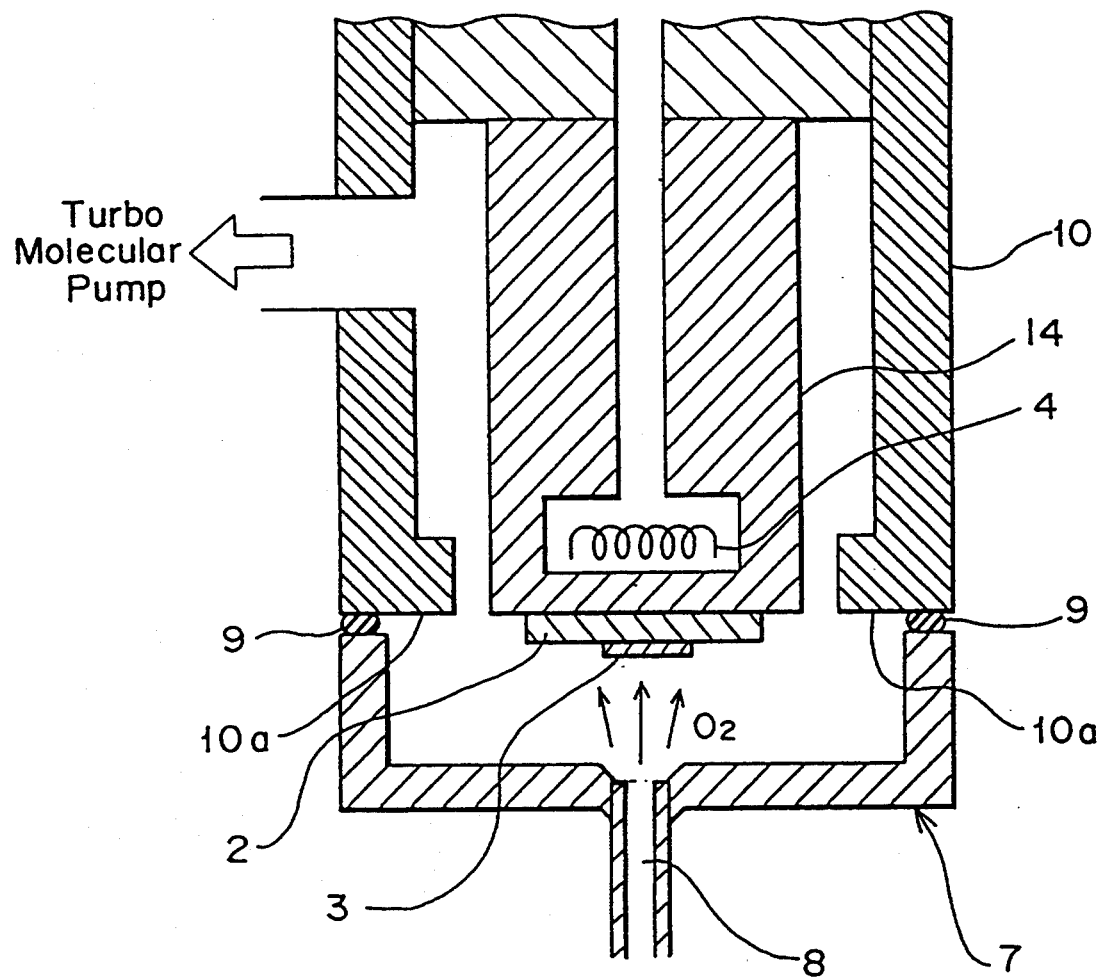
FIG. 2 is an enlarged sectional view of an airtight chamber formed in a vacuum chamber of the apparatus shown in FIG. 1.

FIG. 1 shows an apparatus for producing an oxide thin film in accordance with the present invention. The apparatus is provided with a vacuum chamber 1, a first exhaust system 20, a Knudsen cell 6 serving as a vapor source, and a gas intake system 30. The first exhaust system 20 has a cryopump with which the internal pressure of the vacuum chamber 1 can be reduced to $1 \times 10^{-9}$ Torr or below. The Knudsen cell 6 is provided at a lower portion of the vacuum chamber 1 in order to vaporize upward a metal element. The gas intake system 30 has a gas piping 8 penetrating a lower wall of the vacuum chamber 1. At an uppermost end of the gas piping 8 is mounted a cover member 7 having at its rim portion an O-ring 9 made of a fluorocarbon rubber. The gas piping 8 and the cover member 7 can be moved vertically together in a unit. The gas piping 8 penetrates the cover member 7 to open above the cover member 7. At a portion where the gas piping 8 enters the vacuum chamber 1 is provided with a bellows 13 which keeps the inside of the vacuum chamber 1 airtight. At an upper portion of the vacuum chamber 1 are provided a heater block 14 made of SiC and having a built-in heater 4, a cover receiving member 10 made of stainless steel, and a second exhaust system 40. The cover receiving member 10 is formed of a water-cooled shroud. The cover receiving member 10 is so constructed as to surround the heater block 14. When the cover member 7 is moved upward, the cover receiving member 10 and the cover member 7 form an airtight chamber for enclosing a substrate 3 with the O-ring 9 therebetween, as shown in FIG. 2. It is to be noted that a bottom end surface 10a of the cover receiving member 10 is processed with specular polishing finish in order to prevent possible gas leakage. The O-ring 9 is cooled with water via the cover receiving member 10 to be protected from being damaged by heat while preventing possible gas leakage. Although only one O-ring 9 is employed in the present example, two O-rings 9 can be used one over another to exhibit a high resistance to dust and gas leakage caused by the dust. As shown in FIG. 1, the second exhaust system 40 has a turbo molecular pump and a gas piping 15 penetrating both the cover receiving member 10 and an upper wall of the vacuum chamber 1. By virtue of the turbo molecular pump, the gas inside the airtight chamber can be discharged via the gas piping 15 directly out of the vacuum chamber 1.

Using the above-mentioned apparatus, an oxide thin film is produced as follows. The following description is for producing a CuO thin film as an example of an oxide thin film.

First of all, the inside of the vacuum chamber 1 is evacuated until a pressure of $3 \times 10^{-10}$ Torr is achieved by means of the cryopump of the first exhaust system 20. Then a substrate 3 made of MgO, mounted to a substrate holder 2, is heated by means of the heater 4 and then maintained at a temperature of 600° C. for ten minutes for the purpose of cleaning the surface of the substrate 3. Then the substrate 3 is maintained at a temperature of 275° C., in which condition a material of Cu is evaporated by means of the Knudsen cell 6 (an electron gun 5 may be used instead) to be deposited onto the substrate 3. Since the inside of the vacuum chamber 1 is made to have an extremely high vacuum of $1 \times 10^{-9}$ Torr or less, a Knudsen cell 6 having an excellent vapor-rate controllability can be used. Furthermore, since the vapor source is not oxidized, the vapor rate becomes much more controllable. In the present example, a Cu thin film of a thickness of 50 Å is formed at a film growth speed of 0.2 Å/sec.

Then, after raising the substrate temperature to 575° C., the cover member 7 is moved upward to form in the vacuum chamber 1 an airtight chamber for enclosing the substrate 3 in association with the cover receiving member 10. Subsequently, with the degree of vacuum around the airtight chamber maintained, $O_2$ gas is introduced directly into this airtight chamber via the gas piping 8 by means of the gas intake system 30. The flow rate of the $O_2$ gas is now assumed to be 20 SCCM. At the same time, the airtight chamber is evacuated via the gas piping 15 by means of the turbo molecular pump of the second exhaust system 40. Then the environment around the substrate 3 in the airtight chamber is maintained at a pressure of $2 \times 10^{-2}$ Torr for ten minutes, and the Cu thin film is oxidized to form a CuO thin film. During the oxidization period, the degree of vacuum around the airtight chamber in the vacuum chamber 1 was actually maintained at $3 \times 10^{-10}$ Torr.

Thereafter, the $O_2$ gas in the airtight chamber is discharged directly out of the vacuum chamber 1 until a pressure of $1 \times 10^{-8}$ Torr is achieved. Subsequently, the cover member 7 is made to descend and the substrate 3 is taken out of the vacuum chamber 1. Since the $O_2$ gas or the like is not adsorbed into the internal walls of the vacuum chamber 1, even when producing CuO thin films repeatedly, the inside of the vacuum chamber 1 can be easily put into an extremely high vacuum condition, which leads to increase in productivity of oxide thin films.

Figure 3:
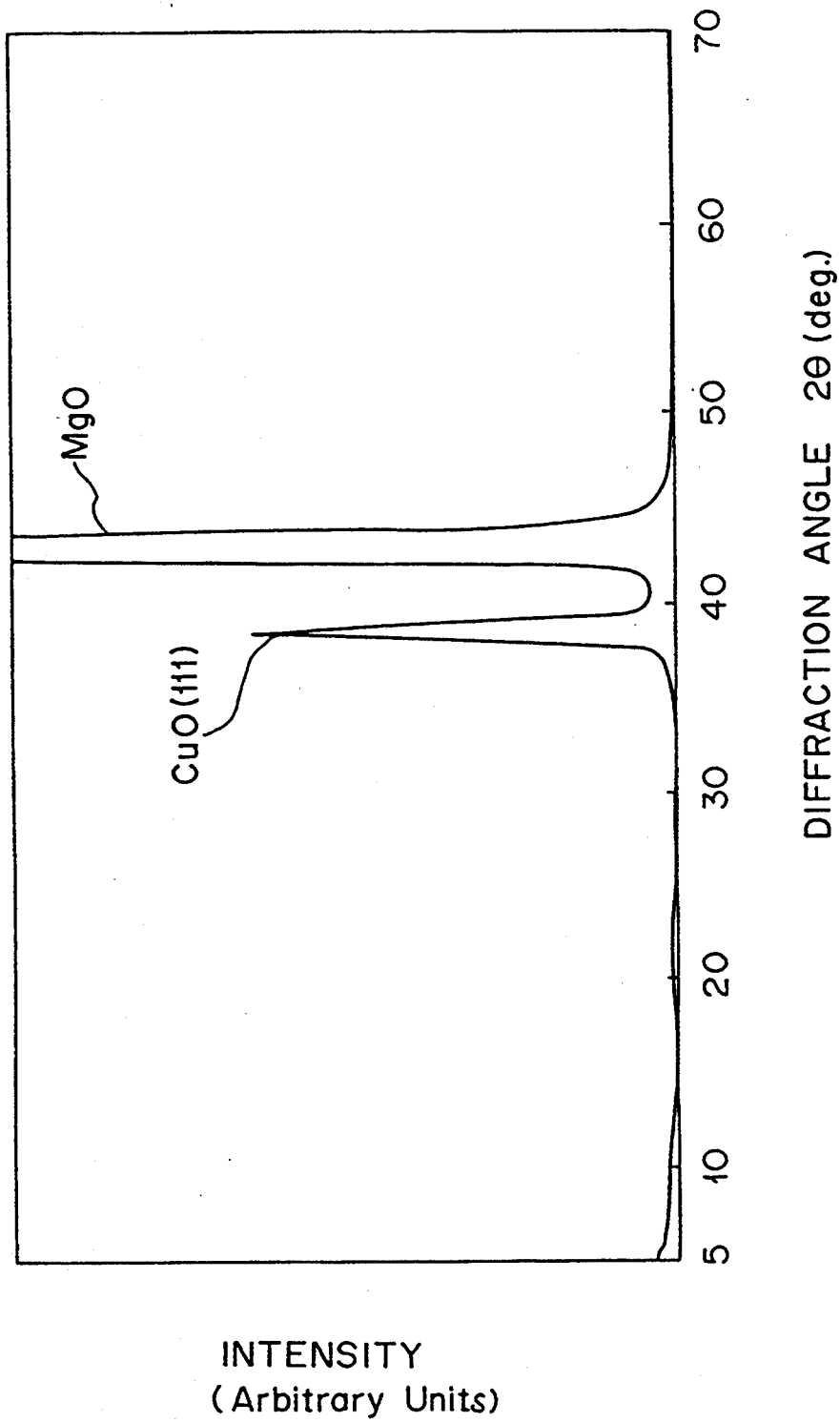
FIG. 3 is a graph of the X-ray diffraction pattern of a CuO thin film produced by the oxide thin film producing method of the present invention.
Figure 4:
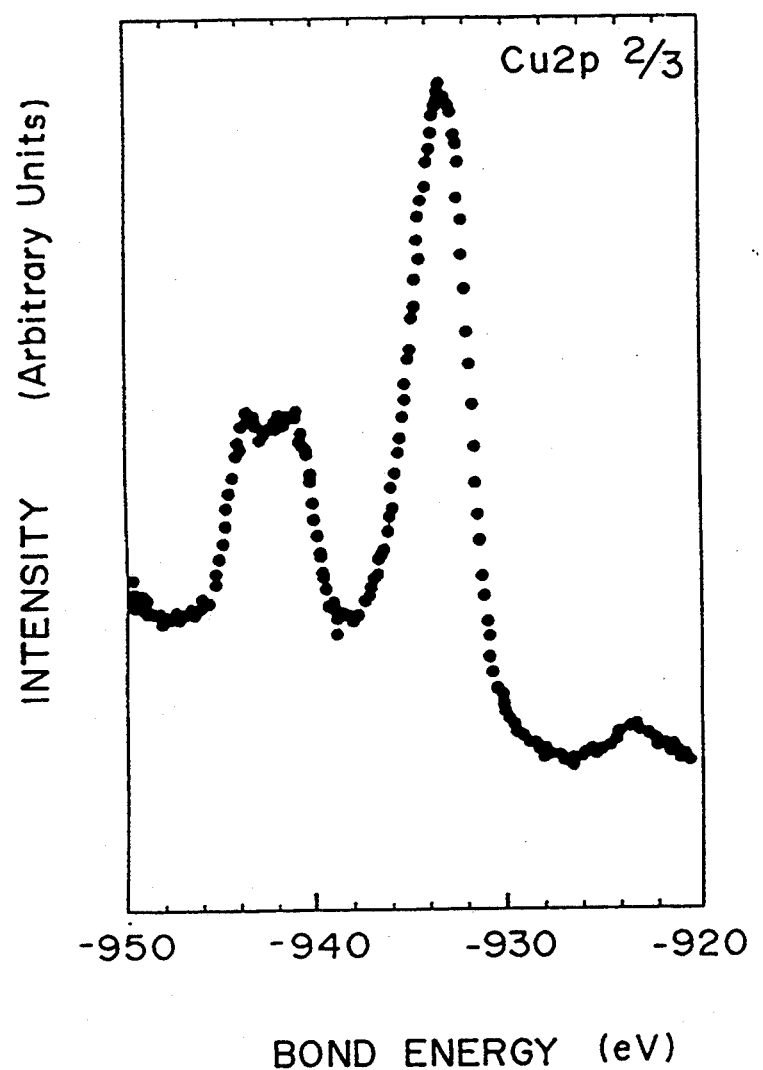
FIG. 4 is a graph showing a photoemission spectroscopic observation result of the CuO thin film produced by the oxide thin film producing method of the present invention.

The thus formed CuO thin film was analyzed by X-ray diffraction. This analysis has indicated that the CuO thin film is of (111)-oriented monocrystal and has a good crystallinity and high purity, as shown in FIG. 3. The CuO thin film was also analyzed through photoemission spectroscopy. The analysis result shown in FIG. 4 says that Cu atoms having the valence number of +2 only exist in the CuO thin film, which indicates that the composition of the thin film is correctly and accurately controlled. The CuO thin film was further observed by reflection high energy electron diffraction (RHEED) method with the result that a streaky RHEED pattern is obtained and the surface of the CuO thin film is very smooth. As described above, a high-quality CuO monocrystalline thin film was actually obtained.

Although $O_2$ gas is used as an oxidization gas in the present embodiment, $O_3$ gas or $NO_2$ gas can be used instead to produce a high-quality CuO monocrystalline thin film.

It was confirmed that, when the vapor deposition process is made to start in the vacuum chamber 1 at a pressure of $8 \times 10^{-8}$ Torr or above, the resulting CuO thin film has a polycrystalline structure and its surface roughness increases. From the above fact, it is concluded that the pressure in the vacuum chamber 1 must be $1 \times 10^{-9}$ Torr or less.

It is noted that, although the present embodiment is described for the case of producing a CuO thin film, a high-quality monocrystalline thin film of yttrium oxide $Y_2O_3$ (insulating material) or rare earth garnet $Y_3Fe_{1-2}O_{19}$ (oxide magnetic substance) can be produced. In such a case, it is necessary to firstly form a metal thin film having a specified composition excluding oxygen O and then oxidize the formed metal thin film.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for producing an oxide thin film comprising:

a vacuum chamber for receiving therein substrate;

means for heating the substrate;

a first exhaust system for reducing a pressure inside the vacuum chamber till vacuum of $1 \times 10^{-9}$ Torr or less is obtained;

a vapor source provided in the vacuum chamber for evaporating a specified metal element toward the substrate;

a cover member provided movably in the vertical direction in the vacuum chamber, the cover member serving to form an airtight chamber for enclosing the substrate airtightly in the vacuum chamber when the cover member has been moved to be positioned in the vicinity of the substrate;

a gas intake system for introducing an oxidizing gas into the airtight chamber while the vacuum is maintained around the airtight chamber; and a second exhaust system for discharging the gas inside the airtight chamber directly out of the vacuum chamber.

2. The apparatus as claimed in claim 1, wherein the gas intake system has a gas piping penetrating both a wall of the vacuum chamber and the cover member, the gas piping being movable together with the cover member.

3. The apparatus as claimed in claim 1, wherein a substrate holder for holding the substrate in place in the vacuum chamber is attached to the heating means, and a cover receiving member for receiving the cover member surrounds the heating means so that the substrate is enclosed by the cover member in association with the cover receiving member when the cover member is positioned in the vicinity of the substrate.

4. The apparatus as claimed in claim 3, wherein the cover member has an O-ring made of rubber at its rim portion so that the cover member is received by the cover receiving member via the O-ring, and the cover receiving member is constituted from a water-cooled shroud.

5. The apparatus as claimed in claim 1, wherein the vapor source is constituted from a Knudsen cell.

* * * * *